United States Patent [19] [11] 3,732,471
Hou et al. [45] May 8, 1973

[54] METHOD OF OBTAINING TYPE CONVERSION IN ZINC TELLURIDE AND RESULTANT P-N JUNCTION DEVICES

[75] Inventors: Shou-Ling Hou, Lexington, Mass.; James A. Marley, Jr., Saratoga, Calif.; Kenneth O. Beck, deceased, late of Billerica, Mass.; by Marilyn Beck, heir, Union, N.J.

[73] Assignee: Corning Glass Works, Corning, N.Y.

[22] Filed: Nov. 10, 1969

[21] Appl. No.: 875,068

[52] U.S. Cl. ....................317/234 R, 148/1.5, 148/33
[51] Int. Cl. ....................H01l 7/02
[58] Field of Search ....................148/1.5; 252/62.3 ZT; 317/234, 235

[56] References Cited

UNITED STATES PATENTS 2,929,859 3/1960 Loferski....................252/62.3 ZT X
3,391,021 7/1968 Esbitt et al....................252/62.3 ZT X
3,533,857 10/1970 Mayer et al....................148/1.5
3,544,468 12/1970 Catano....................252/62.3 ZT

*Primary Examiner*—Dewayne Rutledge
*Assistant Examiner*—J. M. Davis
*Attorney*—Clarence Patty, Jr., Walter S. Zebrowski and William J. Simmons, Jr.

[57] ABSTRACT

A method of making p-n junction devices by bombarding a polished crystal of ZnTe with ions of an element selected from the Group VII A elements and p-n junction devices resulting from this method. When the crystal is held at an elevated temperature during the ion bombardment step, subsequent annealing is usually not necessary. When the crystal temperature is at room temperature or below during the ion bombardment step, type conversion can be obtained only by post implantation annealing. The particular type of p-n junction device and the characteristics thereof are determined by the particular schedule of annealing to which the implanted body is subjected.

9 Claims, 4 Drawing Figures

METHOD OF OBTAINING TYPE CONVERSION IN ZINC TELLURIDE AND RESULTANT P-N JUNCTION DEVICES

BACKGROUND OF THE INVENTION

Zinc telluride belongs to a group of semiconductors which exhibits one majority carrier type. Normal equilibrium impurity diffusion is very seldom useful in providing type conversion, and as a consequence, a large number of materials, including zinc telluride, could not heretofore be considered for fabrication into p-n junction devices.

The hole excess in zinc telluride, a p-type, II-VI compound, is postulated to be the result of zinc vacancies. Elements from Group VII A of the Periodic Chart, which includes the elements F, Cl, Br and I might normally be selected to impart n-type conductivity to zinc telluride. However, when these dopants are introduced under thermal equilibrium, the crystal remains a p-type material or converts to a highly resistive n-type semiconductor. One possible explanation for this result is based on the theory of self-compensation whereby a nearly equal number of oppositely charged defects will be created for every dopant atom introduced from the previous list of n-type impurities. In order to minimize self-compensation, the crystal must be doped under conditions which do not allow the crystalline lattice to reach high temperature equilibrium while the appropriate impurity is introduced an adequate distance into the material.

SUMMARY OF THE INVENTION

It is therefore an object of this invention to provide a method of preparing highly conducting n-type zinc telluride.

Another object of the present invention is to provide a method for converting a body of p-type zinc telluride to n-type material by subjecting the zinc telluride body to high energy dopant implantation and a suitable thermal annealing cycle to remove radiation damage and put the implanted atoms to electrically active states.

Still another object of the present invention is to provide p-n junction devices made by ion implantation of crystalline bodies of zinc telluride, and subsequently annealing the bodies in accordance with one of various possible annealing schedules to control the characteristics thereof.

Briefly, the present invention relates to a method of converting a portion of a body of normally p-type crystalline zinc telluride to n-type material. Ions of a dopant element selected from Group VII A of the Periodic Chart are implanted into one surface of the zinc telluride body which is subjected to a single annealing step which may be performed during or subsequent to the ion implantation step. The annealing step is performed at a temperature between 500° C. and 575° C. for a period of time sufficient to reduce radiation damage caused by the ion implantation and cause the implanted ions to enter into electrically active states in the zinc telluride lattice. Moreover, this period of time must be insufficient to cause the n-type of material so formed to reconvert back to p-type material.

DETAILED DESCRIPTION

Figures 1, 2, 3, 4:
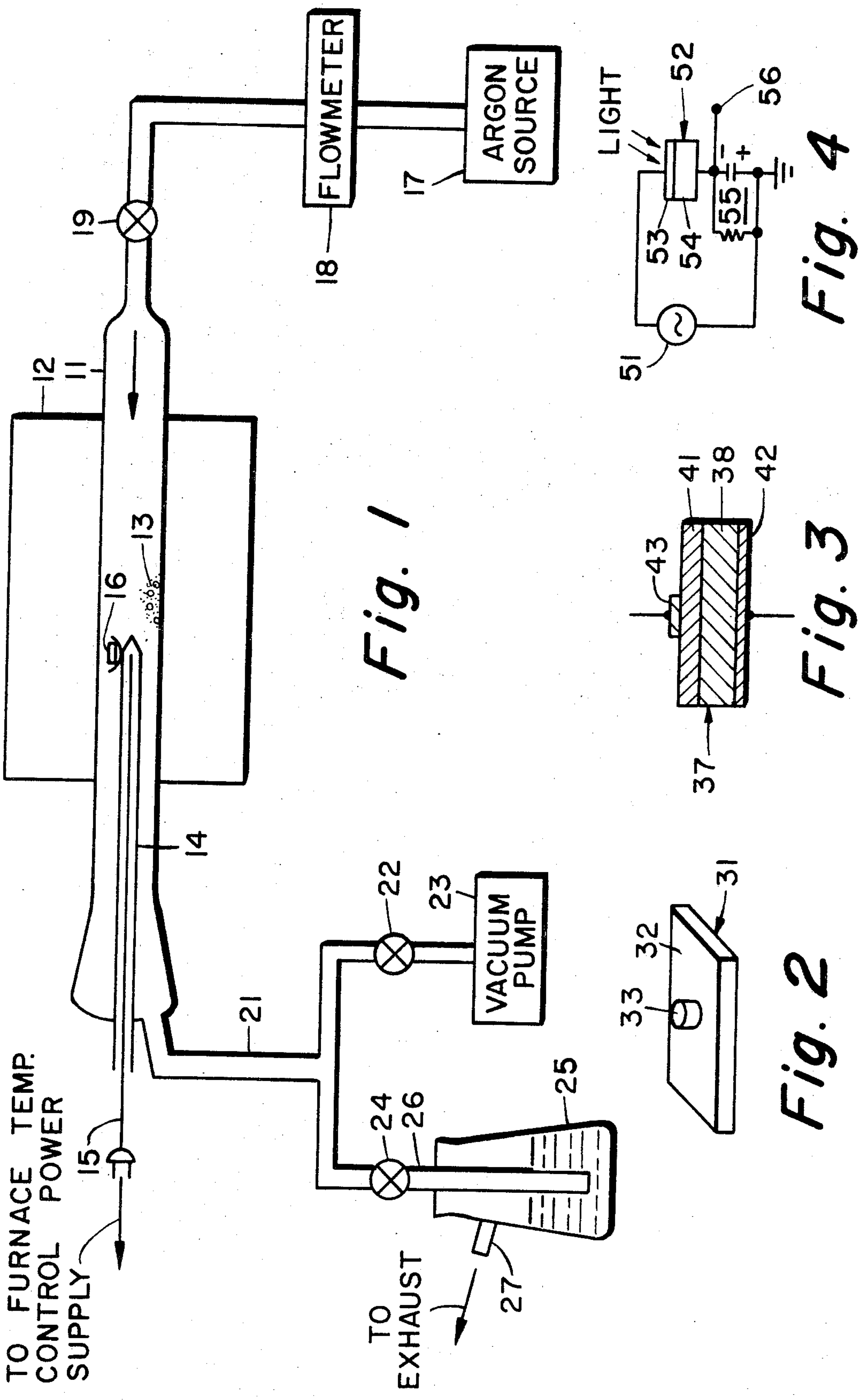
FIG. 1 is a schematic representation of an apparatus which may be used for annealing ZnTe bodies after ion implantation.
FIG. 2 is an oblique view of a support for holding an implanted ZnTe body during annealing.
FIG. 3 is a cross-sectional view of a zinc telluride body having a p-n junction therein.
FIG. 4 is a schematic diagram of a circuit in which a light detecting diode is utilized.

Apparatus for implanting ions into a sample is well known and is described in the literature and in various patents including U.S. Pat. No. 3,388,009 issued to W. J. King on June 11, 1968 and U.S. Pat. No. 3,341,150 issued to R. P. Doland, Jr., et al. on Mar. 4, 1969. Such apparatus basically consists of an ion source, an accelerator tube, a momentum analyzer and an ion deflection system. The sample is mounted on a plate which may be rotatable. The ion beam emerging from the deflection system is directed upon the sample.

P-type ZnTe crystals having a zinc-blende structure and a resistivity of about 15 ohm-cm at room temperature were grown on a quartz substrate. Improved results were obtained when steps were taken to eliminate surface damage and contamination of the surface of the ZnTe body prior to implantation. Therefore, after a single crystal of ZnTe was removed from the substrate, it was mechanically and chemically polished to produce a smooth damage-free surface. Thereafter, the crystal was subjected to a chemical etch consisting of equal parts by volume of concentrated NaOH and water ($NaOH:H_2o = 1:1$) at 70°C for 20 to 60 seconds, thereby providing a surface roughness below 500 . Another chemical etching method consists of boiling the crystal in $H_3PO_4$ for about 20 seconds. However, the former of the two disclosed etching methods is preferred.

After the surface is polished, the ZnTe crystal is placed on the sample holder of the ion implantation apparatus described above. Ions having energies up to 400 keV were implanted, producing a concentration of about $10^{14}$ to $10^{15}$ atoms/cm$^2$ (or $2 \times 10^{18}$ to $2 \times 10^{19}$ atoms/cm$^3$ if a penetration depth of 0.5 micron is assumed). The implantation temperature of the sample may conveniently be room temperature, although it may be above or below room temperature. For example, some implantations were performed at 77° K while others were performed at 400° C. Type conversion was obtained without post annealing when the hot implantation technique was used. However, when the ion implantation is performed at or below room temperature, the implanted crystal must be subjected to post annealing in order to precisely control the characteristics of the resulting devices.

Unless the ion implantation is performed at an elevated temperature, the implanted dopant atoms do not initially substitute for the tellurium atoms and are probably located in interstitial sites. Implantation also produces lattice damage caused by the nuclear bombardment. Proper annealing reduces the damage caused by ion bombardment and causes the implanted atoms to substitute for the tellurium atoms, thereby producing donor states. If the annealing temperature is too high or if the zinc telluride body is subjected to a moderate annealing temperature for too long a period of time, the entire crystal will be brought into thermal equilibrium, thereby causing it to reconvert to the original p-type material.

FIG. 1 is a schematic representation of one type of apparatus which may be used to anneal implanted bodies of zinc telluride. A furnace tube 11 is located in a furnace 12 which may be of the induction heating type. A mixture 13 of small ZnTe crystals and tellurium powder may be spread on the wall of the furnace tube in the central part of the furnace. A body 16 of zinc telluride is located in a sample disc at the end of a support 14. The location of the body 16 such that its temperature is slightly lower than that of the mixture 13. A lead wire 15 connects to a thermocouple which is located at the tip of the support 14 adjacent the body 16. This lead wire may be connected to the furnace temperature control power supply to precisely regulate the temperature of the body 16 during the annealing process. A source 17 of ultra-pure inert gas such as argon is connected to the input end of the furnace tube 11 by way of a flowmeter 18 and a valve 19. The exhaust end of the furnace tube is connected to a vacuum pump by a line 21 and a valve 22. The line 21 is also connected through a valve 24 to a pipe 26 which is located in an oil filled flask 25. The upper portion of the flask 25 is exhausted through the pipe 27.

FIG. 2 is an oblique view of a support which may be provided for the implanted zinc telluride body during annealing. The support 31 consists of a zinc telluride member having a polished surface 32. The implanted surface of a zinc telluride body 33 is disposed adjacent the polished surface 32. This minimizes exposure of the implanted surface during the annealing process.

With the valves 19 and 24 closed and the valve 22 opened, the system is initially pumped to a low pressure. Thereafter, the valve 19 is first opened to flush the system with pure argon gas and thereafter closed while the system is pumped again to assure that no oxygen gas remains therein. Finally, the valve 22 is sealed and the valve 19 is opened to permit pure argon gas to flow through the system at atmospheric pressure. The oil flask 25 is used at the exhaust end to prevent a backflow of air into the system. The flow rate of argon is controlled to about 60 to 130 cc/min. Then the furnace is turned on and is set to the desired annealing temperature. The warm-up time is between 15 and 20 minutes, whereas the cooling time is about 15 to 30 minutes. The temperature at the center of the furnace 12 is such that tellurium and zinc telluride vapors emanate from the material 13 and are carried over the zinc telluride body 16 by the argon gas. The purpose of these vapors is to reduce the decomposition rate of the zinc telluride body. Although it is preferred to anneal in an atmosphere of argon and tellurium vapor, type conversion can be obtained by annealing in pure argon.

The amount of radiation damage which exists in an implanted body depends on such factors as the implantation energy, the total dose of implanted ions, crystal orientation and the like. Since one of the purposes for annealing the body after ion implantation is to reduce radiation damage, the annealing schedule is related to these implantation parameters, i.e., if radiation damage is extensive, the amount of annealing must be greater than that required to remove slight radiation damage.

In general, samples are annealed at temperature between 500° C and 575° C in an atmosphere containing an inert gas and vapors of tellurium and ZnTe as described above for a period of time sufficient to reduce radiation damage and to put the implanted atoms into electrically active states. The total annealing time is usually between 1 and 5½ hours, depending on the desired characteristics of the resultant device. Over annealing brings the entire crystal into thermal equilibrium and causes it to reconvert to the original p-type material. For example, when the crystal is heated to 550° C for about 30 hours or more, the self-compensation effect will begin to cause the type converted layer to revert to p-type material. Similarly, annealing at 625° C for a very short period of time results in deterioration of the implanted surface. Satisfactory p-n junctions have been formed by annealing crystals at temperatures between 500° C and 570° C for periods of time between 1 and 5 hours.

After the implanted crystal is annealed for a time sufficient to reduce radiation damage and to allow the implanted atoms to substitute for the tellurium atoms and thereby form donor states, a p-n junction device of the type shown in FIG. 3 is formed. This cross-sectional view shows a diode 37 which consists of a layer of n-type material 41 located on the surface of the bulk crystal 38 of p-type ZnTe. The junction depth is typically about 0.5 micron for 400 keV implantation. $BF_3$ was used as the ion source material to implant fluorine ions into the ZnTe crystals.

The diode shown in FIG. 3 is electroded by sputtering a layer 42 of platinum or gold to the bulk of the zinc telluride body 38. The n-type implanted side of the body can be electroded by evaporating or ultrasonically soldering a layer 43 of indium thereon. Copper wires are soldered on the electrodes by indium. The resultant diode is forward biased when the layer 41 of n-type material is biased negative with respect to the bulk crystal 38.

FIG. 4 is a schematic diagram of a circuit in which the diode of FIG. 3 can be placed to function as a light detector. A source 51 of ac potential is connected in series with a diode 52 and a parallel R-C network 55. The n-type surface layer is designated by the numeral 53, and the p-type bulk crystal is designated by the numeral 54. With the diode oriented as shown, a negative dc potential is generated at the terminal 56 due to the rectification of the ac voltage supplied by the source 51.

The greatest amount of photosensitivity is achieved when a diode is annealed for such a short time that type conversion is barely started. For example, an implanted ZnTe crystal annealed at 550° C for 1 hour produced a photosensitive diode which exhibited a high gain when biased in the forward direction.

Another crystal was annealed at 500° C for 1 hour and then at 550° C for 2 hours. The resultant diode had a breakdown voltage greater than −25 V and exponential I-V characteristic in forward bias. The forward resistance under room light was 1,000 ohms at +15 V, and the back-bias resistance was several megohms. Furthermore, the diode was highly photosensitive when biased in the forward direction. Room light changed the forward current from 0.1 mA in the dark to 0.7 mA at a bias of +9 V. This indicates that the highly resistive n-type layer in the p-n junction may have been formed. The photosensitive behavior may be due to the resistance change at the edge of the contact under illumination, or due to the photo p-n junction. It is though that the photosensitive behavior is due to the latter reasons because the I-V characteristics are no longer photosensitive when the diode is annealed for 550° C for longer than 3 hours.

Annealing a fluorine-implanted ZnTe crystal for 4 – 5½ hours produces a small signal rectifier. For example, one crystal was annealed for 5 hours at 550° C, and the implantation concentration was $10^{15}$ atoms/$cm^2$. The series forward resistance was 100 ohms, while the back-bias resistance at −1.5 V was 40,000 ohms. An anomalous forward current knee occurred at only +0.1 V. These facts indicate that the type-converted n-type layer may be highly conductive after such an annealing schedule. When a crystal is annealed for less than 4 hours, the series resistance is too high for small signal detection. When a crystal is annealed for more than about 5½ hours, the series resistance increases and the leakage resistance is reduced so that the I.V. characteristics begin to become soft.

The forward current knees for diodes made of Ge, Si and GaAs are 0.4 V, 0.5 to 0.7 V and 0.9 to 1.1 V, respectively. Since the above described diode has a knee of only 0.1 V, it is useful for small signal rectification. For example, it can be used as a sensitive microwave detector or in solid-state computer logic circuits.

An open circuit photovoltaic effect, which peaked at 5,500 A. (in agreement with the 2.26 –eV band gap of ZeTe at 300° K), was observed across a diode produced by annealing an implanted crystal for 4 to 5 hours. A relatively small signal was obtained from a diode which was annealed at 500° C for one hour, at 525° C for 1 hour and then at 550° C for 2 hours. Further annealing at 550° C for 1 additional hour increased the photovoltaic effect 12 times (48 mV under room light). The implanted layer is negative with respect to the bulk crystal. However, annealing a crystal for more than a total of 5 or 6 hours caused the leakage resistance to become so reduced that the resultant diode was unsuitable for use as a solar cell.

A low voltage electroluminescence was detected at room temperature in diodes annealed at a temperature between 525° C and 575° C for 2 to 5 hours. Orange electroluminescence was observed under the electrode on the implanted layer at −78° C for a forward current of 15 mA. The light intensity was proportional to the square of the forward current which indicated that a recombination took place in the depletion layer. No electroluminescence was observed in a diode which was annealed at 550° C for 7 hours.

We claim:

1. The method of converting a portion of a body of normally p-type crystalline zinc telluride to n-type material comprising the steps of subjecting one surface of said body to a single ion implantation process during which ions of a dopant element selected from Group VII A of the Periodic Chart are implanted into one surface of said body and annealing said body at a temperature between 500° C and 575° C for a period of time sufficient to reduce radiation damage caused by said ion implantation and cause said implanted ions to enter into electrically active states in the zinc telluride lattice, said period of time being insufficient to cause the n-type material so formed to reconvert back to p-type material.

2. The method of claim 1 wherein said dopant element is fluorine.

3. The method of claim 1 wherein said annealing step comprises preheating said body to said temperature and maintaining said temperature during the step of implanting ions into said body.

4. The method of claim 1 wherein said ion implantation step is performed at a temperature which is less than said annealing temperature and said annealing step is performed subsequent to said ion implantation step.

5. The method of claim 4 wherein said period of time for which said body is annealed is between one and five and one-half hours.

6. The method of claim 4 wherein said annealing is performed in an atmosphere including an inert gas.

7. The method of claim 6 wherein said atmosphere includes tellurium vapor.

8. The method of claim 6 wherein, prior to said annealing step, the method includes the step of placing said body on the polished surface of a zinc telluride member, the implanted surface of said body being adjacent said polished surface.

9. A p-n junction device of the type selected from the group consisting of light detectors, small signal rectifiers, solar cells and light emitters, said device comprising a body of normally p-type crystalline zinc telluride, one surface of which has been converted to n-type material by implanting therein ions of a dopant element selected from Group VII A of the Periodic Chart, and annealing said body at a temperature between 500° C and 575° C for a period of time between 1 and 5½ hours, and first and second electrodes respectively disposed on said one surface and on a portion of said body that is remote from said one surface, said annealing reducing radiation damage caused by said ion implantation and causing said implanted ions to enter into electrically active sites in the zinc telluride lattice, said period of time during which said body is annealed being insufficient to deteriorate the electrical properties of the type converted surface.

* * * * *